United States Patent
Groulx et al.

(10) Patent No.: US 6,833,282 B2
(45) Date of Patent: Dec. 21, 2004

(54) METHOD OF FORMING AN OPTICAL SENSOR DEVICE HAVING A COMPOSITE SANDWICH STRUCTURE OF ALTERNATING TITANIUM AND TITANIUM NITRIDE LAYERS

(75) Inventors: Robert Groulx, Sherbrooke (CA); Raymond Frost, Ascot (CA); Yves Tremblay, Brigham (CA)

(73) Assignee: DALSA Semiconductor Inc., Waterloo (CA)

( * ) Notice: Subject to any disclaimer, the term of this patent is extended or adjusted under 35 U.S.C. 154(b) by 0 days.

(21) Appl. No.: 10/435,043

(22) Filed: May 12, 2003

(65) Prior Publication Data

US 2003/0197209 A1 Oct. 23, 2003

Related U.S. Application Data

(63) Continuation of application No. 09/658,135, filed on Sep. 8, 2000, now abandoned.
(60) Provisional application No. 60/162,763, filed on Nov. 1, 1999.

(30) Foreign Application Priority Data

Sep. 11, 1999 (GB) .............................................. 9921392

(51) Int. Cl.$^7$ ................................................ H01L 21/00
(52) U.S. Cl. .......................... 438/22; 438/24; 438/27; 438/29; 438/31; 438/75; 438/76
(58) Field of Search ........................... 438/22, 24, 27, 438/29–32, 75, 76

(56) References Cited

U.S. PATENT DOCUMENTS

| | | | | |
|---|---|---|---|---|
| 4,553,154 A | * | 11/1985 | Tsujii | 257/743 |
| 5,317,187 A | * | 5/1994 | Hindman et al. | 257/659 |
| 6,087,253 A | * | 7/2000 | Liaw | 438/648 |

* cited by examiner

*Primary Examiner*—Hsien Ming Lee
(74) *Attorney, Agent, or Firm*—Marks & Clerk

(57) ABSTRACT

In order to make a charge couple device including an interconnect layer to contact active areas, a first layer of a first titanium nitride layer on the active areas, and then a series of alternating titanium and titanium nitride layers are deposited to form a composite sandwich structure. This structure is less prone flaking while able to withstand high temperature treatment during fabrication of backside illuminated sensors to improve quantum efficiency and reduce dark current.

8 Claims, 1 Drawing Sheet

METHOD OF FORMING AN OPTICAL SENSOR DEVICE HAVING A COMPOSITE SANDWICH STRUCTURE OF ALTERNATING TITANIUM AND TITANIUM NITRIDE LAYERS

CROSS REFERENCE TO RELATED APPLICATION

This application is a continuation application under 35 USC 120 of prior U.S. application Ser. No. 09/658,135 filed Sep. 8, 2000 now abandoned and claims the benefit under 35 USC 119(e) of prior U.S. provisional application Ser. No. 60/162,763 filed on Nov. 1, 1999.

FIELD OF THE INVENTION

This invention related to optical sensor devices, such as charge coupled devices (CCDs), and in particular to a method of making an optical sensor device with one or more metallization layer(s) capable of withstanding high temperature treatment to improve quantum efficiency and reduce dark current.

BACKGROUND OF THE INVENTION

As is well known in the art, charge coupled devices are used in a variety of optical applications and are the active component in video cameras. Such devices consist of an array of overlapping field effect transistors with a polysilicon contact layer formed over the gate, and over which is placed a pyroglass protective layer with contact openings so that an overlying metalization layer forming interconnects can make contact with the exposed polysilicon.

Typically, an aluminum alloy is used as the metalization layer in semiconductor devices. The problem with aluminum is that it will not withstand temperatures in excess of about 450° C., whereas in order to reduce dark current, CCDs need to be annealed at temperatures considerably higher than this. In the prior art, it is known to replace aluminum by tungsten, but the problem with tungsten is that it forms under stress, which causes it to flake, and also it does not adhere well to N+ and P+ silicon contacts.

An object of the invention is to alleviate the aforementioned problems in the prior art.

SUMMARY OF THE INVENTION

According to the present invention there is provided a method of making an optical sensor device subject to a high temperature anneal, comprising the steps of providing a structure including transistors with active areas including a polysilicon gate contact layer; and forming an interconnect layer on said active areas by: (i) depositing a first titanium nitride sublayer on said active areas including said polysilicon gate contact layer; (ii) depositing on said first titanium nitride sublayer a plurality of alternating titanium and titanium nitride sublayers in a collimated sputtering chamber alternately in the absence and presence of nitrogen to Form a composite sandwich structure such that compressive and tensile stresses in said alternating titanium and titanium nitride sublayers substantially cancel out; and wherein said titanium nitride sublayers are deposited as stoichiometric layers.

The titanium nitride/titanium (TiN/Ti) sandwich structure is capable of withstanding the anneal temperatures required to reduce dark current. The titanium is in tensile stress and the TiN in compressive stress. By suitably depositing the layers, the stresses cancel out and thus eliminate the flaking problems experienced in the prior art.

The top layer of the sandwich structure is also preferably TiN since titanium oxidizes quickly, but it could be titanium.

The structure is also simple to form since it can be applied in a single sputtering chamber. To switch from Ti to TiN, it is merely necessary to turn on the supply of nitrogen.

The Ti/TiN is preferably deposited in a common collimated sputtering chamber. The collimator is located below the titanium target and reduces the titanium flux on the lower side of the collimator so that stochiometric TiN can be deposited on the wafer. With the collimator TiN having a bulk resistivity of 50 micro ohm cm. can be obtained.

The invention also provides an optical sensor device including an interconnect layer to contact active areas, wherein said interconnect layer comprises a first layer of titanium nitride layer on said active areas; and a plurality of alternating titanium and titanium nitride layers to form a composite sandwich structure.

BRIEF DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
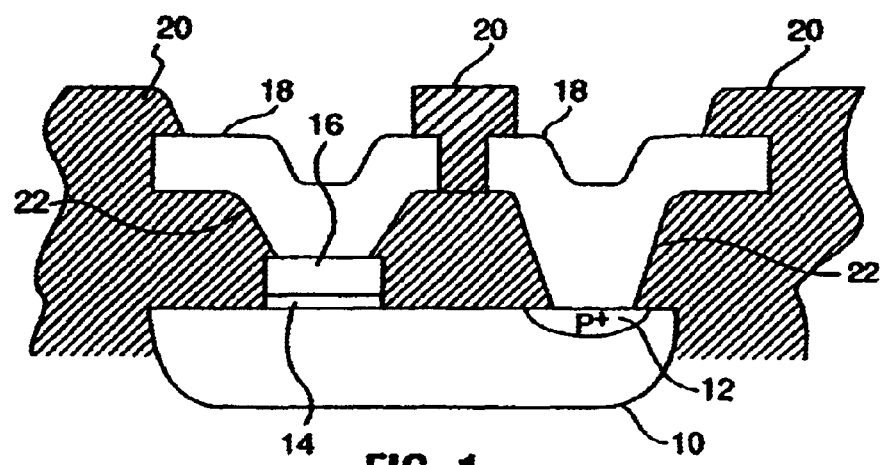
FIG. 1 is a schematic view showing a metalization layer in a charge coupled device.

Referring now to FIG. 1, the charge coupled device comprises a silicon substrate 10 containing transistors with active areas, such as P+ active area 12, for example, source and drain regions of FETs, and gate 14. Polysilicon contact layers 16, for example consisting of poly 1, 2 and 3 layers are deposited on the contact gate 14.

Typically, a PSG protective layer 20 is deposited over the poly layers 16 and active areas 12 to protect the exposed layers. Contact holes 22 are then formed in the PSG layer 20 to expose the silicon layers 16. An interconnect layer 18 is deposited on the polysilicon layers 16 and the active areas 12 to provide the necessary interconnections between the component elements of the device.

As will be seen the interconnect layer 18 must be deposited on the polysilicon layer 16 and also the active P+ area 12.

The interconnect layer 18 consists of a TiN/Ti/TiN/Ti/TiN sandwich structure. Each TiN sublayer is 100 to 3000 Å thick and each Ti sublayer is 20 to 1000 Å thick.

Figure 2:
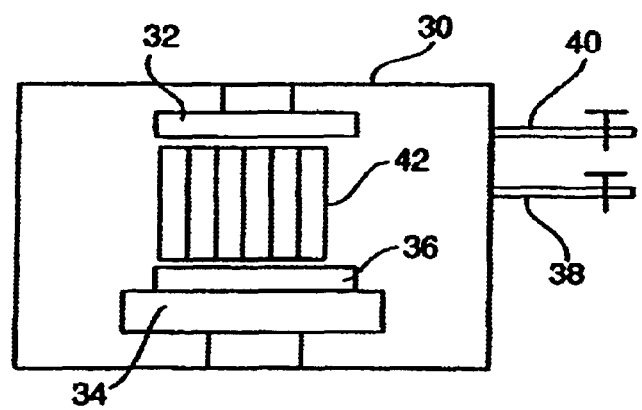
FIG. 2 is a schematic view of a sputtering chamber with collimator.

The sublayers are deposited in a collimated sputtering chamber as shown FIG. 2. This consists ot a conventional sputtering chamber 30 with titanium target 32, and wafer support 34 shown on supporting wafer 36. A first supply line 38 is provided for an inert gas, typically argon, and a second supply line 40 is provided for nitrogen.

Collimator 42, which is provided between the titanium target 32 and the wafer 36, consists of a honeycomb arrangement of longitudinal channels that transfer only the titanium atoms travelling in the vertical direction onto the wafer with the result that the titanium flux under the collimator is at least five times less than immediately under the tungsten target.

The high titanium flux above the collimator prevents the titanium target from being poisoned by the nitrogen gas during the deposition of TiN. This ensures that the titanium target remains pure and results in a very uniform layer of high quality, stoichiometric TiN being deposited on the wafer. This is important to ensure low resistivity of the TiN layer.

With a five layer structure as described for the interconnect layer 18, which has a total thickness of 1000 to 10000 Å, it is possible to achieve a sheet resistance of about 1 Ω per square. This is quite an achievement, in part due to the use of the collimated sputtering system which permits the manufacture of TiN layers having very good sheet resistance. The resulting sandwich is substantially stress free.

It is known that the sheet resistance of titanium decreases with layer thickness, but typically greater thicknesses would be required at the risk of increasing stress.

The TiN bonds well to poly and $N^+$ or $P^+$ silicon with low contact resistance. Even though the conductivity of TiN is normally poor, in combination with Ti in the structure described, it has excellent properties.

Another important advantage of the structure described arises in connection with back illuminated CCDs. In this case, the substrate, which may start off about 675 microns thick, is thinned to less than 25 microns to make it transparent to incident light. The sandwich structure described does not have a tendency to flake or cause the wafer to bow as the thickness is reduced because the tensile and compressive stresses cancel.

The invention is also applicable to CMOS active pixel sensors or other circuitry.

We claim:

1. A method of making an optical sensor device subject to a high temperature anneal, comprising the steps of:
    (a) providing a structure including transistors with active areas including a polysilicon gate contact layer; and
    (b) forming an interconnect layer on said active areas by:
        (i) depositing a first titanium nitride sublayer on said active areas including said polysilicon gate contact layer;
        (ii) depositing on said first titanium nitride sublayer a plurality of alternating titanium and titanium nitride sublayers in a collimated sputtering chamber alternately in the absence and presence of nitrogen to form a composite sandwich structure such that compressive and tensile stresses in said alternating titanium and titanium nitride sublayers substantially cancel out; and
    wherein said titanium nitride sublayers are deposited as stoichiometric layers.

2. A method as claimed in claim 1, wherein a top layer of said composite sandwich structure is titanium nitride.

3. A method as claimed in claim 1, wherein said titanium nitride sublayers are approximately 100 to 3000 Å thick.

4. A method as claimed in claim 1, wherein said titanium sublayers are approximately 20 to 1000 Å thick.

5. A method as claimed in claim 1, wherein said optical sensor is a charge coupled device.

6. A method as claimed in claim 1, wherein said collimated sputtering chamber includes a collimator having an arrangement of longitudinal channels to transfer only titanium atoms traveling in a direction along said channels.

7. A method as claimed in claim 6, wherein said arrangement is a honeycomb arrangement.

8. A method as claimed in claim 7, wherein said longitudinal is the vertical direction.

* * * * *